(12) United States Patent
Kawahara

(10) Patent No.: US 6,258,630 B1
(45) Date of Patent: Jul. 10, 2001

(54) RESIN-SEALED SEMICONDUCTOR DEVICE HAVING ISLAND FOR MOUNTING SEMICONDUCTOR ELEMENT COUPLED TO HEAT SPREADER

(75) Inventor: Yoshinori Kawahara, Kumamoto (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/494,927

(22) Filed: Feb. 1, 2000

(30) Foreign Application Priority Data

Feb. 4, 1999 (JP) ................................................. 11-027012

(51) Int. Cl.⁷ .................................................... H01L 21/44
(52) U.S. Cl. ........................ 438/122; 438/124; 438/126; 257/675
(58) Field of Search .................................... 438/111, 112, 438/122–127; 257/666, 675, 706, 707, 719

(56) References Cited

U.S. PATENT DOCUMENTS

| 5,365,107 | * | 11/1994 | Kuraishi et al. | 257/673 |
| 5,384,286 | * | 1/1995 | Hirai | 257/675 |
| 5,434,105 | * | 7/1995 | Liou | 438/122 |
| 5,489,805 | * | 2/1996 | Hackitt et al. | 257/675 |
| 5,750,423 | * | 5/1998 | Ishii | 438/124 |
| 5,864,174 | * | 1/1999 | Yamada et al. | 257/676 |
| 6,048,754 | * | 4/2000 | Katayama et al. | 438/122 |
| 6,049,971 | * | 4/2000 | Petit | 438/122 |

FOREIGN PATENT DOCUMENTS 5-36862    2/1993   (JP) .

* cited by examiner

*Primary Examiner*—Kevin M. Picardat

(57) ABSTRACT

A resin-sealed semiconductor device of the present invention includes: a lead frame having an island on which a semiconductor element is mounted and inner leads; and a heat spreader for diffusing heat generated in the semiconductor element, resin-sealing is made while the heat spreader, the island bottom and the inner leads are in face-contact with one another without an adhesive, and a part of the heat spreader is in contact with a part of the inner leads at the perimeter. The heat diffusion efficiency of the heat spreader is enhanced.

18 Claims, 8 Drawing Sheets

RESIN-SEALED SEMICONDUCTOR DEVICE HAVING ISLAND FOR MOUNTING SEMICONDUCTOR ELEMENT COUPLED TO HEAT SPREADER

BACKGROUND OF THE INVENTION

1. Field of the Invention

The present invention relates to a semiconductor device, in particular to a resin-sealed semiconductor device in which heat radiation from a package is improved.

2. Description of the Related Art

For high power consumption semiconductor devices which usually generate heat inside during operation, there has been proposed various methods of enhancing capability of radiating heat from a package.

For instance, a semiconductor device, as shown in FIG. 12, includes an island 102 on which a semiconductor element 101 is mounted, a lead frame 103 having an inner lead 104, and a heat spreader 106. The heat spreader 106, the island 104 and the lead frame 103 of the semiconductor device are fixed with a low melting point metal plating 105. In another case, a heat spreader and a lead frame are adhered to each other with an adhesive in Japanese Laid-Open patent application No. 5-36862.

However, such conventional resin-sealed semiconductor devices have their respective problems.

That is, in the above case where the island is fixed to the heat spreader with the low melting point metal plating, the low melting point metal plating is molten at the time of resin injection, so that the fixation is not secure. For that reason, the contact between the heat spreader and the island is sometimes incomplete. The case where the heat spreader and the island are adhered to each other using an adhesive has a drawback of rising in production cost due to expensiveness of the adhesive.

SUMMARY OF THE INVENTION

An object of the present invention is to provide a semiconductor device which is resin-sealed while a part of a lead frame and a heat spreader are in contact with each other without using an adhesive.

A semiconductor device of the present invention includes a semiconductor element; a lead coupled to said semiconductor element; an island on which the semiconductor element is mounted; and a heat spreader being in direct contact with the island, the heat spreader having a suspending portion at its corner in contact with the lead; and a resin sealing the semiconductor element, the lead, the island, and the heat spreader including the suspending portion.

A method of manufacturing a semiconductor device of the present invention, includes:

applying a semiconductor element to the top of an island of a lead frame;

connecting inner leads on the lead frame to bonding pads on the semiconductor element by bonding wires;

putting a heat spreader in a lower mold;

placing the lead frame with the semiconductor element mounted thereto on the heat spreader so that the lead frame is in contact with the heat spreader on the lower mold;

covering the lead frame and the heat spreader on the lower mold with an upper mold;

injecting a resin into an inner space defined by the lower and upper mold while perimeter portions of the lead frame and of the heat spreader is pressed by and held between the upper mold and the lower mold; and cutting off suspending pins of the heat spreader after the resin is cured.

BRIEF DESCRIPTION OF THE DRAWINGS

FIG. 2A is a sectional view of the semiconductor device shown in FIG. 1 in line A–A' and FIG. 2A is a sectional view of the semiconductor device shown in FIG. 1 in line B–B'.

DETAILED DESCRIPTION OF PREFERRED EMBODIMENTS

Figure 1:
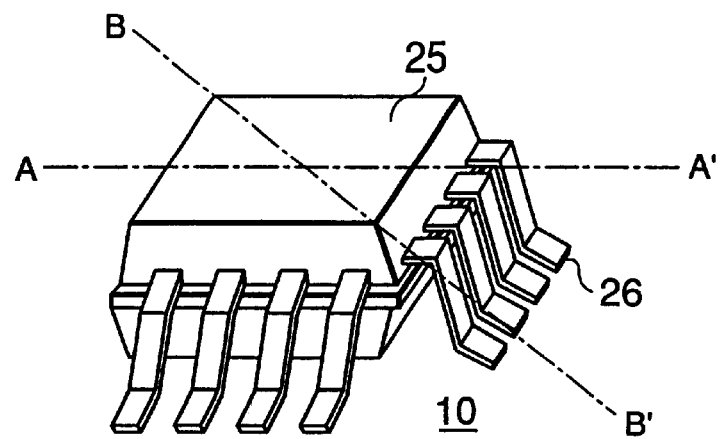
FIG. 1 is a view of a semiconductor device showing a first embodiment of the present invention.
Figure 2A:
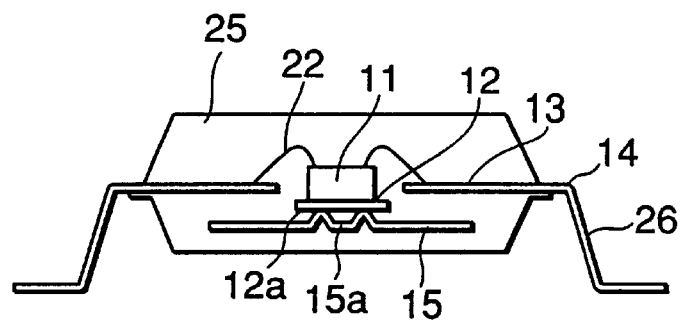
FIGS. 2A and 2B are cross sectional views of the semiconductor device shown in FIG. 1.
Figure 2B:
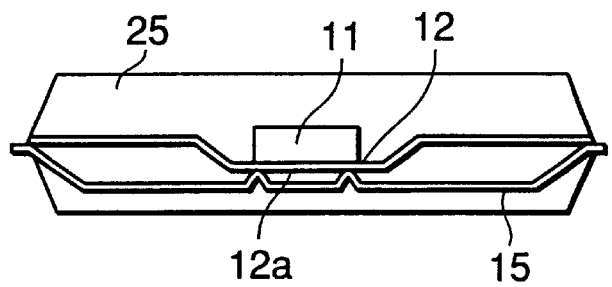

FIG. 1 is a view of a resin-sealed semiconductor device showing a first embodiment of the present invention. FIG. 2A is a sectional view of the semiconductor device shown in FIG. 1 in line A–A' and FIG. 2A is a sectional view of the semiconductor device shown in FIG. 1 in line B–B'.

A semiconductor device 10 of the present invention comprises a lead frame 14 having an island 12 and a heat spreader 15 for diffusing heat generated in the semiconductor element 11. The semiconductor element 11 is mounted on the island 12. The lead frame 14 has an inner lead 22 coupled to a metal wire 22 and an outer lead 26 extending outside from a resin-package 25. The heat spreader 15 has projections 27 at a radiation portion 15a which are in contact with the island 12 with a predetermined width or a point. Therefore, the heat spreader 15 does not adhere with the island 12 by an adhesion.

Figure 3:
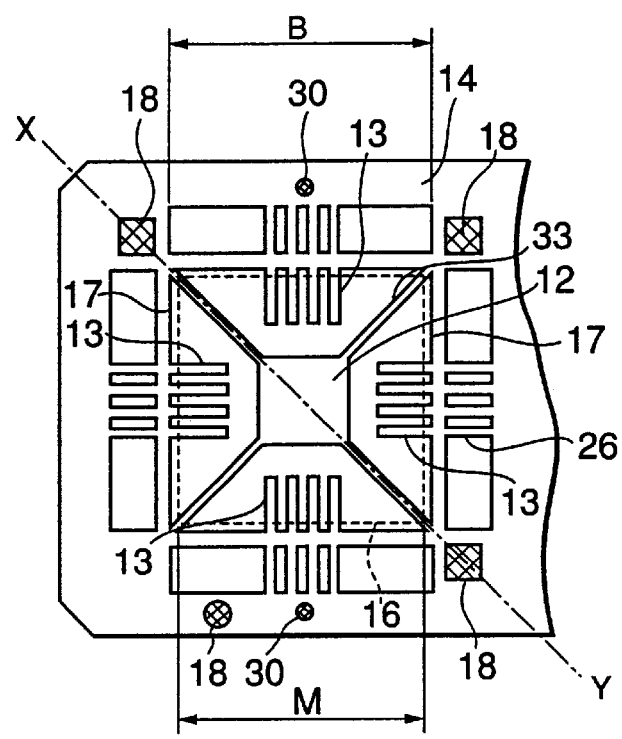
FIG. 3 is a plane view showing a lead frame for use in the semiconductor device shown in FIG. 1.

FIG. 3 is a plane view of a lead frame 14 before it is cut off. The lead frame 14 has an island 12 at its central portion and inner leads 13 at its peripheral potion. The inner leads 13 and outer leads 26 are fixed with tie bars 17. Suspending leads 33 are coupled to four corners of the island 12. The lead frame 14 has holes 18 which is used to cut off suspending pins 15b of the heat spreader 15. The lead frame 14 has lead frame alignment holes 30. A measurement M is a mold line 16 so that a mold is sealed in the mold line 16. A measurement B is a tie bar line.

Figure 4:
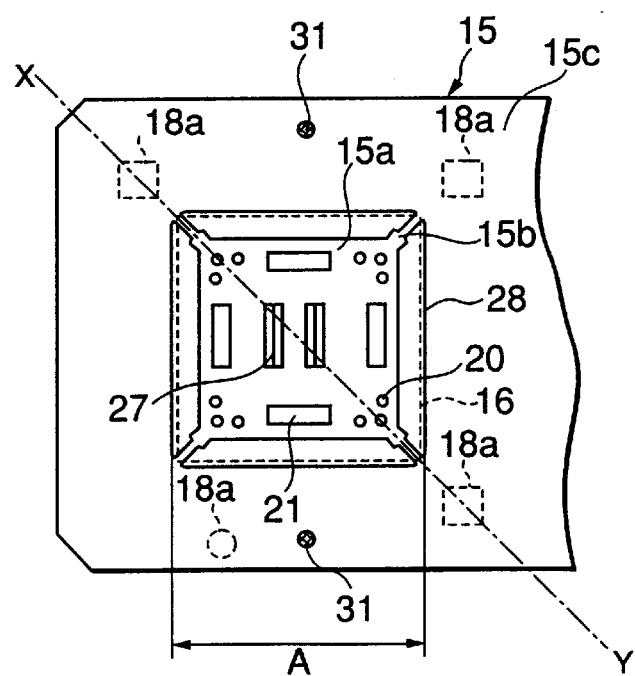
FIG. 4 is a plane view showing a heat spreader for use in the semiconductor device shown in FIG. 1.

FIG. 4 is a plan view of a heat spreader 15 before it is cut off. The heat spreader 15 has a radiation portion 5a, an outer portion 15c, and suspending pins 15b which connect the respective radiation portion 15a with the respective outer portion 15c. Dimples 20, slits 21 and projections 27 are formed at the radiation portion 15a. The projections 27 of the heat spreader 15 are coupled to the island 12 to enhance the radiation efficiency. The heat spreader 15 is made of a metal. The suspending lead 33 of the lead frame 14 is in contact with the peripheral portion of the heat spreader 15, that is, the suspending pins 15b to enhance radiation efficiency. Dimples 20 and slits 21 enhance the fluidity of the resin and the adhesion between the resin and the heat spreader 15. Measurement A is a resin sealed line.

Figure 5:
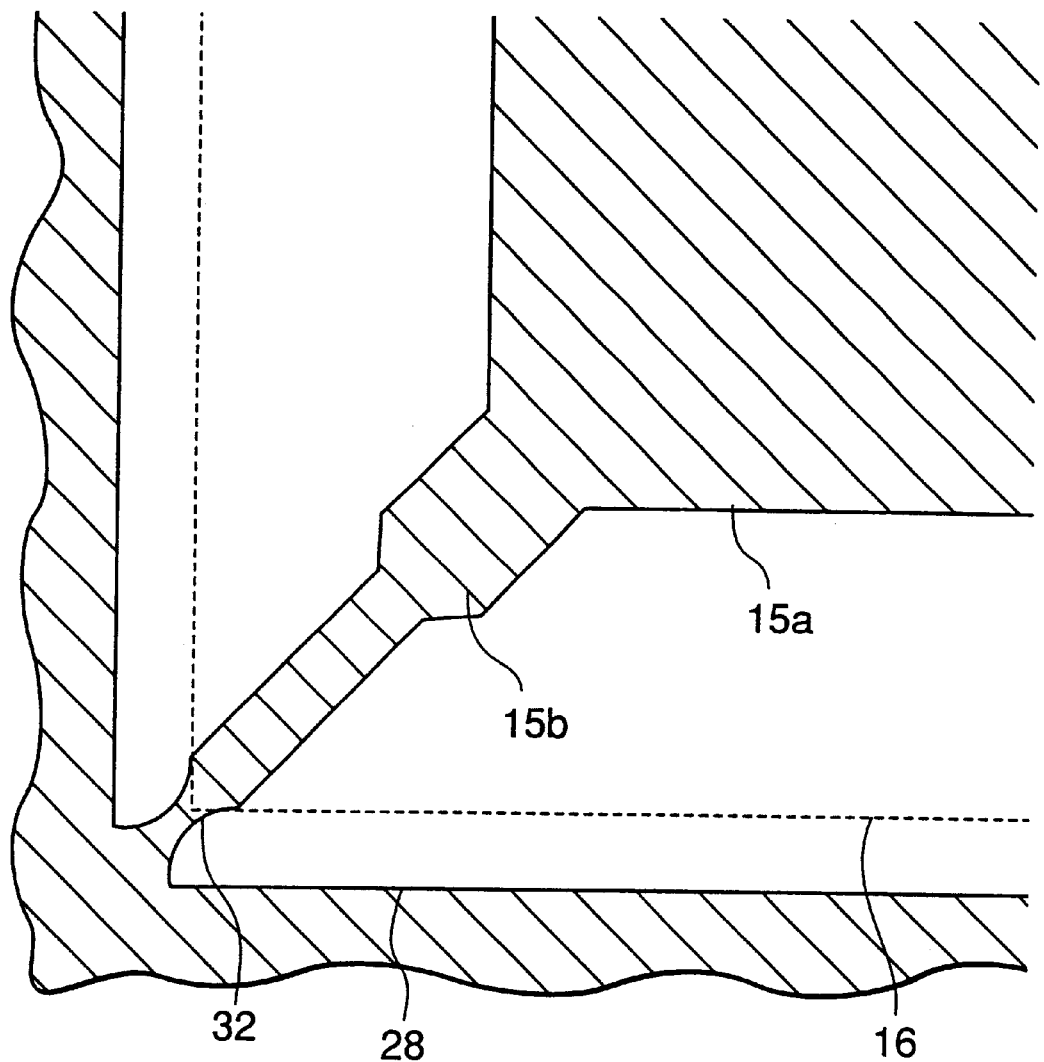
FIG. 5 is a plane view showing an enlarged part of the heat spreader shown in FIG. 4.

FIG. 5 is an enlarged plane view of the heat spreader 15 at the suspending pins 15b thereof. Each of the suspending pins 15b has a constriction 32 at the crossing point with the mold line 16. In place of the constriction 32, a notch or a cut end may be formed.

Figure 6A:
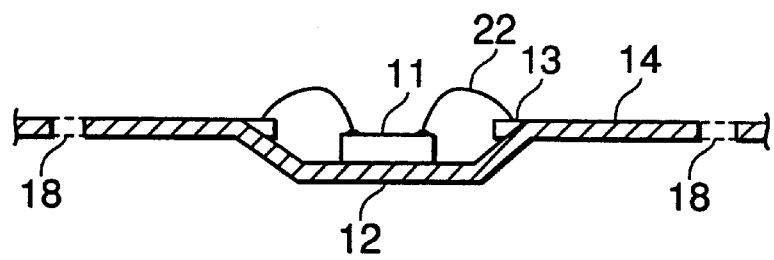
FIGS. 6A to 6D are explanatory diagrams showing a manufacturing method of a semiconductor device according to the present invention.
Figure 6B:
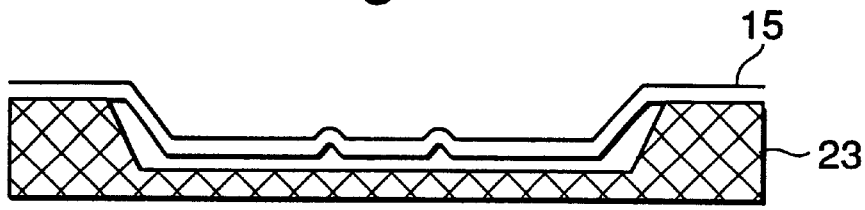
Figure 6C:
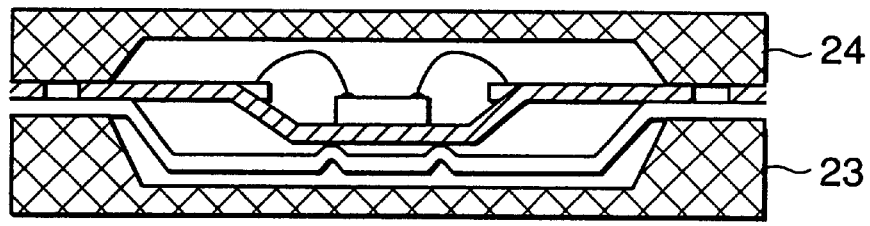
Figure 6D:
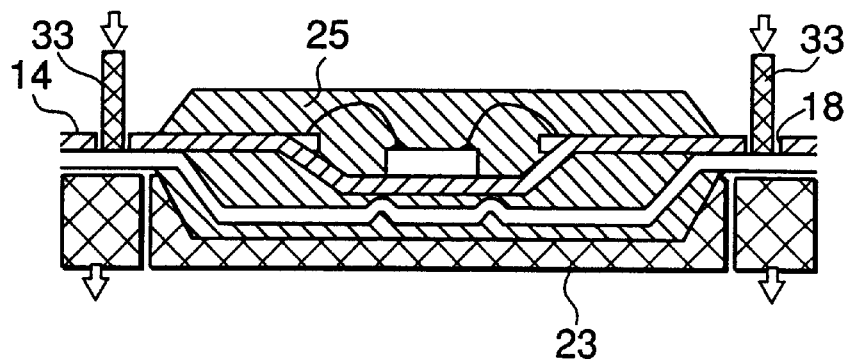

FIGS. 6A to 6D are cross sectional views respectively showing the semiconductor devices in line X–Y of FIGS. 3 and 4 to explain the manufacturing method of a resin-sealed semiconductor device according to the present invention. At a mounting step, as shown in FIG. 6A, a semiconductor element 11 is applied to the top face of a silver-plated island 12 of a lead frame 14. The element 11 may be adhered to the island 12 with a resin adhesive. At the next step of bonding, inner leads 13 on the lead frame 14 and bonding pads on the semiconductor element 11 are bonded to each other with metallic wires 22. Holes 18 are formed in the lead frame 14. Next, the lower mold 23 having pins (not shown) is prepared. The heat spreader 15 is sank into a concave portion of the lower mold 23, as shown in FIG. 6B by inserting the pins of the lower mold 23 into the holes 31 of the heat spreader 15 so that the heat spreader 15 is positioned and supported by the lower mold 23. As shown in FIG. 6C, the lead frame 14 with the semiconductor element 11 mounted thereto is sank into the concave portion of the lower mode 23 so that the lead frame 14 is placed onto the heat spreader 15 by inserting the pins of the lower mold 23 into the holes 31 of the lead frame 30 and the lead frame 14 is in contact with the heat spreader 15. Then an upper mold 24 caps thereof and a fused resin is injected with pressure into the space between the molds 23 and 24. There is no fear that the positional shift takes place in the perimeter portions of the lead frame 14 and of the heat spreader 15, for the portions are pressed by and held between the lower mold 23 and the upper mold 24 at this point. After the resin is cured and the upper mode 24 is removed, suspending pins 15b of the heat spreader 15 are cut off as shown in FIG. 6D by inserting pins 33 through holes 18 of the lead frame 14 and putting the positions 18a of the heat spreader 14. Through the steps as described above, the resin-sealed semiconductor device is manufactured.

Figure 7A:
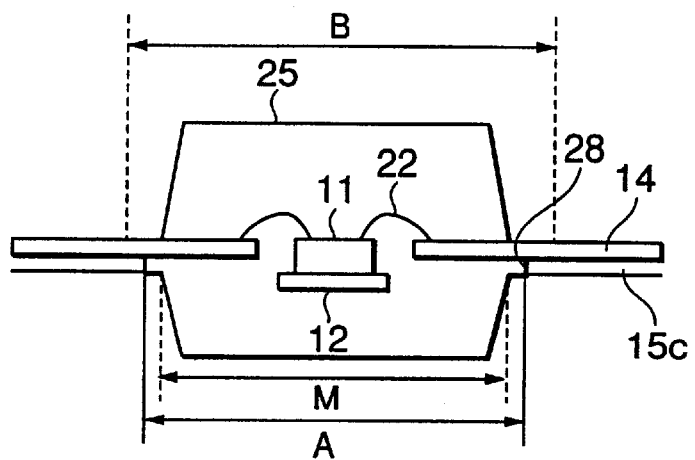
FIGS. 7A to 7D are cross sectional views for explanations of the effect of the semiconductor device according to the present invention.

FIGS. 7A to 7D show the relationship of the resin-sealed measurement A of the heat spreader 15, the mold line measurement M, and the tie bar measurement B. The measurement A is larger than the measurement M and is smaller than the measurement B, as shown in FIG. 7A.

Figure 7B:
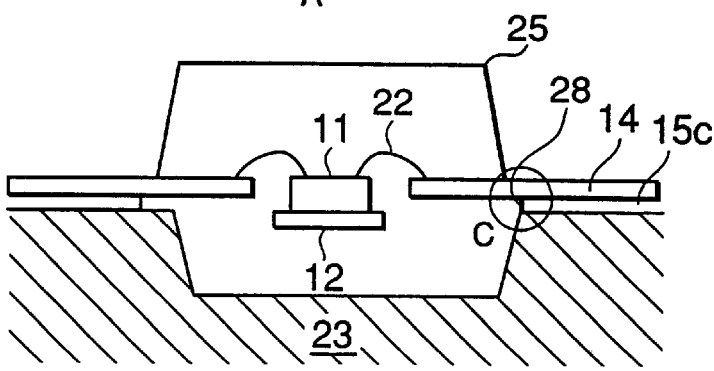
Figure 7C:
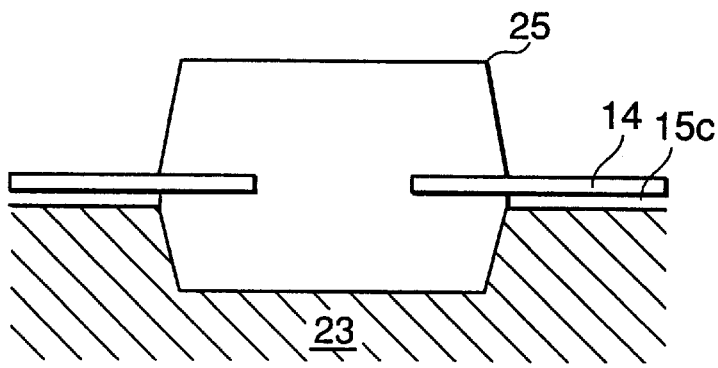
Figure 7D:
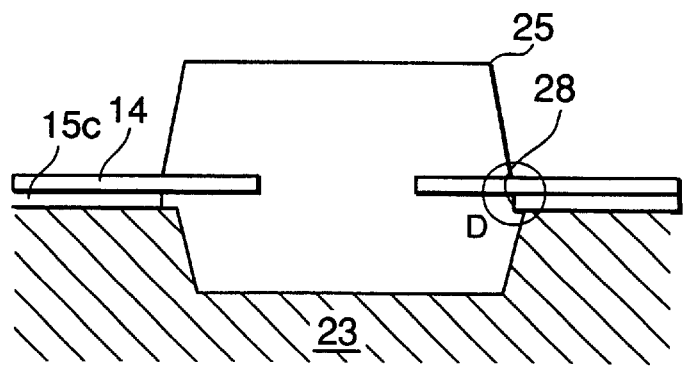

The heat spreader 15 and the lead frame 14 is positioned by the pins at a predetermined precision, for example, ±50 µm against the lower mold 23. In this case, the measurement A is set larger than the measurement M by 50 µm or wider respectively in a right and a left direction. Therefore, as shown in FIG. 7B, even if the heat spreader 15 is off the side by 50 µm (the heat spreader 15 shown in FIG. 7B slides against the lower mold 23 in the left direction), the bottom surface of the outer portion 15c of the heat spreader 15 is not covered with the mold resin 25 (See the circle C of FIG. 7B). On the other hand, the resin sealed measurement A is smaller than the mold line measurement M by the predetermined precision, for example, the resin sealed measurement A is the same as the mold line measurement M (See FIG. 7C), the outer portion 15C encroaches into the mold resin 25, resulting preventing the heat spreader 15C from removing at the following steps (See the circle D of FIG. 7D). The seal measurement A is smaller than the tie bar measurement B to prevent the mold resin 25 from covering the tie bar 17 which is cut off at the following steps.

Figure 8:
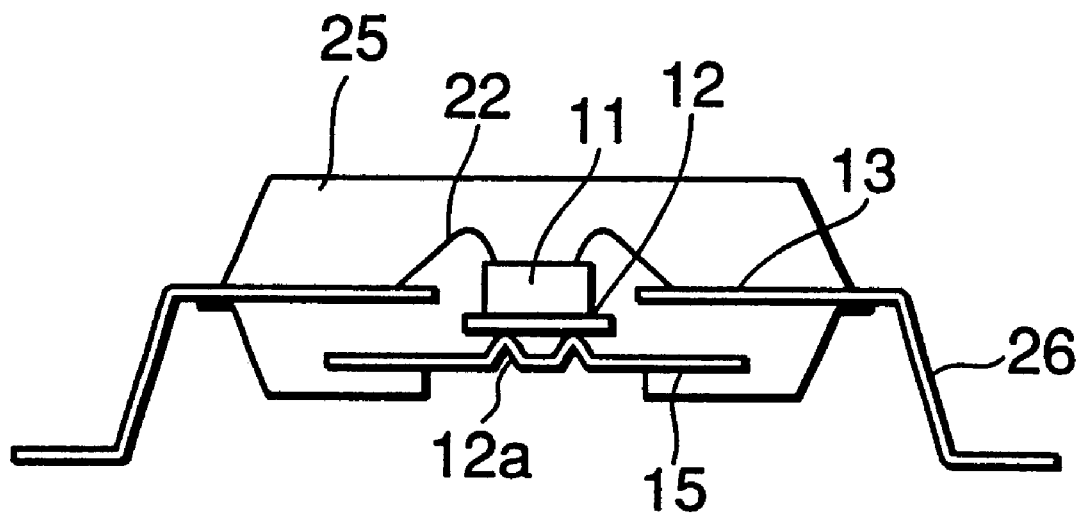
FIG. 8 is a cross sectional view of a semiconductor device showing a second embodiment of the present invention.

FIG. 8 is a cross sectional view of a resin-sealed semiconductor device showing a second embodiment of the present invention. In this embodiment, the rear surface of the heat spreader 15 is not covered with the resin but is exposed directly to the air. The structure as above can attain more enhanced heat radiation effect, owing to the heat spreader 15 with its rear surface devoid of the resin covering. Since the other structure of the second embodiment is substantially the same as that of the first embodiment, the explanation should be omitted.

Figure 9:
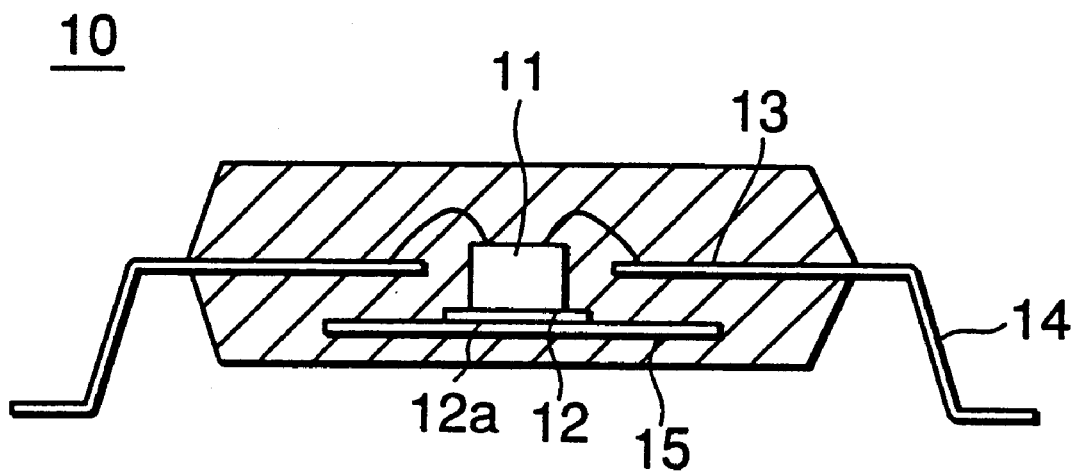
FIG. 9 is a cross sectional view of a semiconductor device showing a third embodiment of the present invention.

FIG. 9 is a cross sectional view of a resin-sealed semiconductor device according to a third embodiment of the present invention. The heat spreader 15 is sealed with the island 12 by the surface contact. Since the other structure and a method of forming the semiconductor device is the substantially same as then of the semiconductor device according to the first embodiment, the explanation is omitted.

Figure 10:
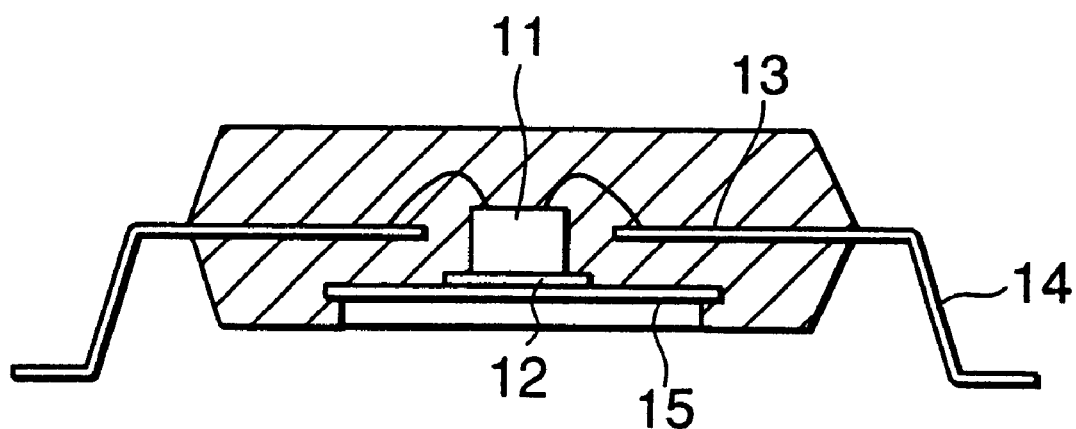
FIG. 10 is a cross sectional view of a semiconductor device showing a third embodiment of the present invention.

FIG. 10 is a cross sectional view of a resin-sealed semiconductor device according to a fourth embodiment of the present invention. The rear surface of the heat spreader 15 is not covered with the resin but is exposed directly to the air. Since the other structure of the fourth embodiment is substantially the same as that of the third embodiment, the explanation should be omitted.

Figure 11:
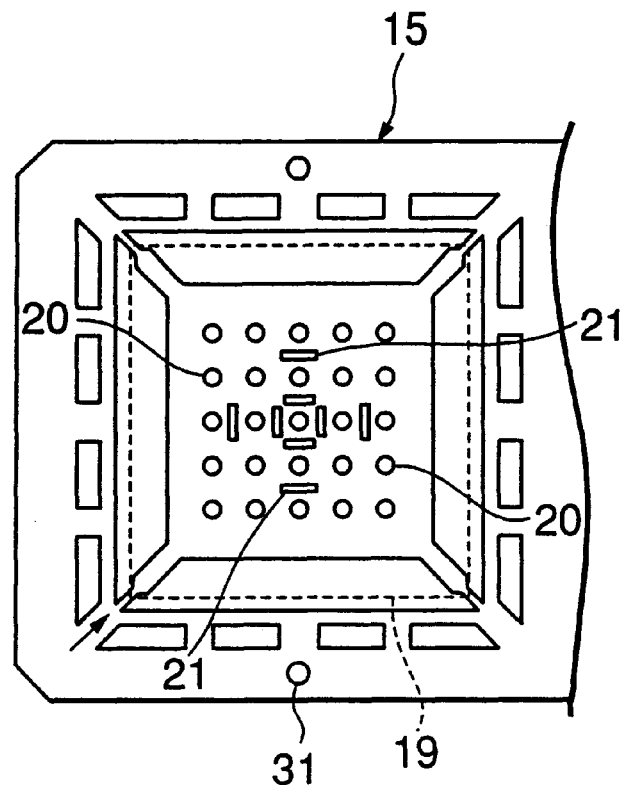
FIG. 11 is a plane plan view showing a part of the heat spreader shown in FIGS. 9 and 10.
Figure 12:
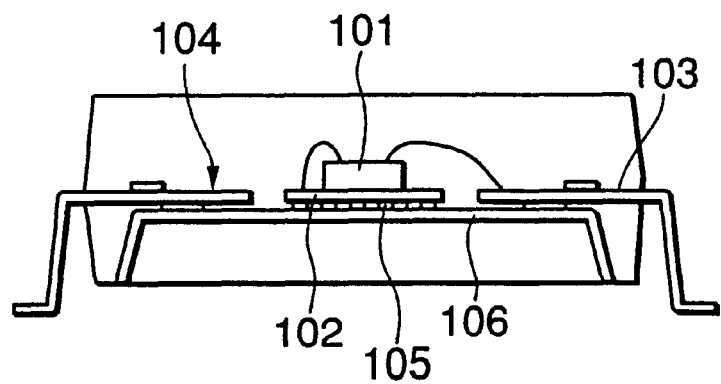
FIG. 12 is a cross sectional plan view showing a conventional resin-sealed semiconductor device.

FIG. 11 is a plan view of a heat spreader 15 which is used by the semiconductor device shown in FIGS. 9 and 10. Dimples 20 are arranged at a heat radiation potion thereof in a matrix and slit 21 is arranged at a center portion of the heat radiation portion. The other structure of the heat spreader 15 shown in FIG. 11 is the substantially same as that of the heat spreader 15 shown in FIG. 4, the explanation is omitted.

A first effect of the present invention stands in marked contrast to any conventional resin-sealed semiconductor device in which a drop-in heat spreader is unstable and tends to stray from the fixed position within a package, resulting in insufficient reliability. That is because the present invention can attain stable contact between the lead frame and the heat spreader without an adhesive, for their perimeter portions are pressed by and held between the upper mold and the lower mold while the resin is injected with pressure, reaching a state of fixed contact upon sealing. A second effect of the present invention is inexpensive price since, unlike the prior cases, the invention does not include the need to use any adhesive. Note that the present invention is not limited to the embodiments above but is a subject of modification in design in various kinds of way which places its basis in the technical concept of the invention.

What is claimed is:

1. A semiconductor device comprising:

a semiconductor element;

a lead coupled to said semiconductor element;

an island on which said semiconductor element is mounted; and a heat spreader being in direct contact with said island without using an adhesive, said heat spreader having a suspending portion at its corner in contact with said lead; and a resin sealing said semiconductor element, said lead, said island, and said heat spreader including said suspending portion.

2. The device as claimed in claim 1, wherein said heat spreader is made of a metal plate.

3. The device as claimed in claim 1, wherein said heat spreader has a projection which is in contact with said the bottom surface of said island.

4. The device as claimed in claim 3, wherein said heat spreader has a plurality of slits and a plurality of dimples.

5. The device as claimed in claim 4, wherein said dimples are arranged at corners of said heat spreader.

6. The device as claimed in claim 5, wherein said slits are arranged between said dimples.

7. The device as claimed in claim 6, wherein said projection is arranged at a center of said heat spreader.

8. The device as claimed in claim 7, wherein the back surface of said heat spreader is not covered by said resin to be exposed by an air.

9. A semiconductor device comprising:

an island;

a semiconductor element formed on a top surface of said island;

a plurality of inner leads;

a suspending lead extending from a corner of said island;

a plurality of bonding wires coupled between said inner leads and said semiconductor element;

a heat spreader having a radiation portion and a suspending portion extending from a corner of said radiation portion, said radiation portion having a first surface being in direct contact with a bottom surface of said island, said suspending portion being in direct contact with said suspending lead;

a plurality of outer leads each coupled to the respective inner leads; and a resin covering said island, said semiconductor element, inner leads, said suspending lead, said bonding wires, said heat spreader including said radiation portion and said suspending portion.

10. The device as claimed in claim 9, wherein a projection is formed at said first surface of said radiation portion so that said projection is in direct contact with said island.

11. The device as claimed in claim 10, wherein said radiation portion is larger than said island.

12. The device as claimed in claim 11, wherein said radiation portion has a plurality of slits and a plurality of dimples.

13. The device as claimed in claim 12, wherein said dimples are arranged at corners of said radiation potion.

14. The device as claimed in claim 13, wherein said slits are arranged between said dimples.

15. The device as claimed in claim 14, wherein a second surface of said radiation portion is not covered by said resin to be exposed by an air.

16. A method of manufacturing a semiconductor device, comprising:

applying a semiconductor element to the top of an island of a lead frame;

connecting inner leads on said lead frame to bonding pads on said semiconductor element by bonding wires;

putting a heat spreader in a lower mold;

placing said lead frame with the semiconductor element mounted thereto on said heat spreader so that a bottom surface of said lead frame is in direct contact with said heat spreader on said lower mold;

covering said lead frame and said heat spreader on said lower mold with an upper mold;

injecting a resin into an inner space defined by said lower and upper mold while perimeter portions of said lead frame and of said heat spreader is pressed by and held between said upper mold and said lower mold; and cutting off suspending pins of said heat spreader after the resin is cured.

17. The method as claimed in claim 16, wherein said suspending pins of said heat spreader has a notch which is cut off.

18. The method as claimed in claim 17, wherein a seal measurement is larger than a mold line measurement and is smaller than a tie bar measurement.

* * * * *